(12) United States Patent
Shor et al.

(10) Patent No.: US 7,935,627 B1
(45) Date of Patent: May 3, 2011

(54) FORMING LOW DIELECTRIC CONSTANT DIELECTRIC MATERIALS

(76) Inventors: Yakov Shor, Beer Sheva (IL); Semeon Altshuler, Rishon Le Zion (IL); Valery Shumilin, Ashkelon (IL); Alexander Ripp, Beer Sheva (IL)

( * ) Notice: Subject to any disclaimer, the term of this patent is extended or adjusted under 35 U.S.C. 154(b) by 68 days.

(21) Appl. No.: 12/398,298

(22) Filed: Mar. 5, 2009

(51) Int. Cl.
*H01L 21/4763* (2006.01)
*H01L 23/48* (2006.01)

(52) U.S. Cl. ......... 438/637; 438/638; 257/750; 257/753

(58) Field of Classification Search .................. 438/618, 438/622, 637, 638, 654; 257/750, 753, 758, 257/760
See application file for complete search history.

(56) References Cited

U.S. PATENT DOCUMENTS

| | | | |
|---|---|---|---|
| 2004/0053498 A1* | 3/2004 | Kaji et al. | 438/687 |
| 2006/0154471 A1* | 7/2006 | Minami | 438/618 |
| 2007/0152336 A1* | 7/2007 | Lee et al. | 257/758 |

* cited by examiner

*Primary Examiner* — Kevin M Picardat
(74) *Attorney, Agent, or Firm* — Trop, Pruner & Hu, P.C.

(57) ABSTRACT

In some embodiments, a damascene structure may be formed with metal lines separated by a dielectric layer. Portions of the dielectric layer may be ion implanted with carbon and/or inert species to lower selectively the dielectric constant, while leaving the bulk of the dielectric layer unaffected by the implant. As a result, suitably low dielectric constants can be achieved in damascene dielectric layers with sufficient mechanical strength.

14 Claims, 2 Drawing Sheets

FORMING LOW DIELECTRIC CONSTANT DIELECTRIC MATERIALS

BACKGROUND

This relates generally to the fabrication of integrated circuits.

In the fabrication of integrated circuits, metal lines may be formed to carry signals between integrated components. One factor that adversely affects the signals carried along such metal lines is capacitance between proximate metal lines. The capacitance is a function of the dielectric constant of the dielectric material between the metal lines. Thus, it is advantageous to form dielectrics between metal lines with relatively low dielectric constants.

For example, in the widely used damascene process, trenches are formed in a dielectric and these trenches may be filled with metal layers to form metal lines. Thus, the dielectric between the metal lines is actually formed before the lines themselves.

Existing techniques for forming dielectric layers of lower dielectric constant generally result in relatively low mechanical strength. Thus, the resulting integrated circuits may be more prone to failure because of the poor mechanical characteristics of the lower dielectric constant dielectric layer.

DETAILED DESCRIPTION

In accordance with some embodiments, a dielectric may be formed which has both low dielectric constant and suitable mechanical strength. In some embodiments, implants may be done in a way that provide the desired low dielectric constant in certain critical areas, while leaving other areas of the dielectric unaffected by the implants, so that overall the dielectric layer exhibits suitable mechanical strength.

Figure 1:
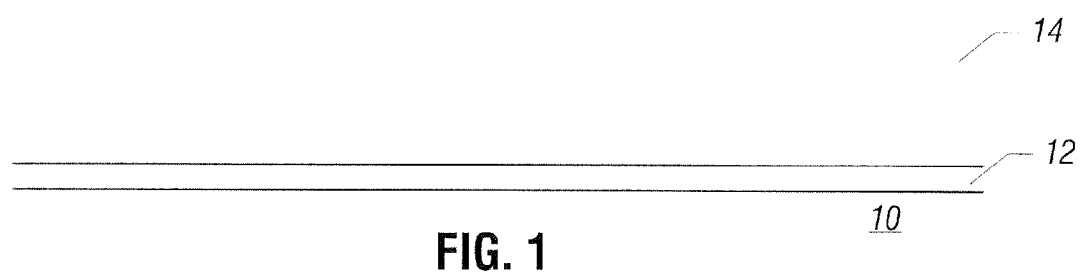
FIG. 1 is an enlarged, cross-sectional view at an early stage of manufacture in accordance with one embodiment.

Referring to FIG. 1, an etch stop layer 12 may be formed over an integrated circuit substrate 10 in one embodiment. The etch stop layer 12, in one embodiment, may be silicon nitride. A dielectric layer 14 may be formed over the etch stop layer 12. The dielectric layer 14 may be silicon dioxide and, in one embodiment, may be high density plasma or HDP oxide.

The deposition of the dielectric layer 14 can be by HDP deposition or plasma enhanced chemical vapor deposition, to mention two examples. It may be silicon dioxide, in one embodiment, or fluorinated glass as another example. Furnace thermal growth may also be used.

Figure 2:
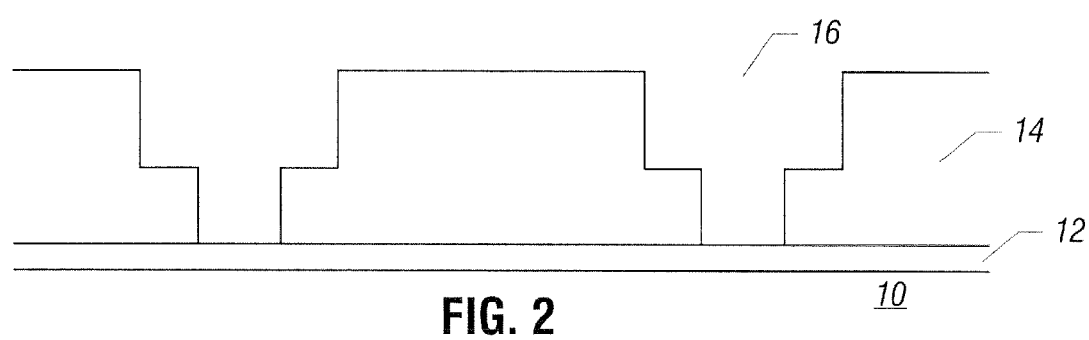
FIG. 2 is an enlarged, cross-sectional view at a subsequent stage to that shown in FIG. 1 in accordance with one embodiment.

In accordance with one embodiment, shown in FIG. 2 a plurality of trenches 16 may be formed through the dielectric layer 14, down to the etch stop layer 12. The trenches 16, in some embodiments, may be formed by conventional etching techniques using conventional damascene technology to form damascene structures. In the embodiment shown in FIG. 2, the trenches have a wider upper region and a narrower lower region.

Figure 3:
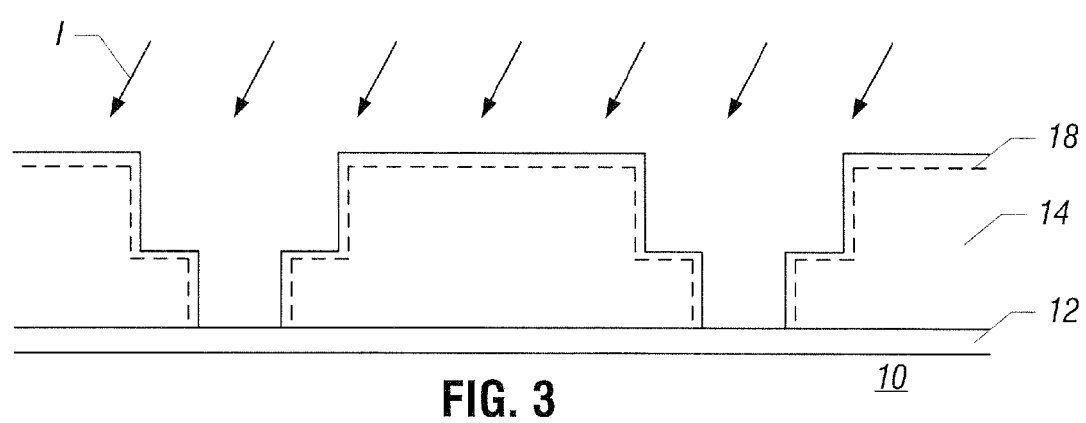
FIG. 3 is an enlarged, cross-sectional view at a stage subsequent to that shown in FIG. 2 in accordance with one embodiment.

Then, referring to FIG. 3, the trenches 16 may be subjected to an ion bombardment I to reduce the dielectric constant of the bombarded portion of the dielectric layer. As used herein, the term "bombardment" includes any process that propels ions into a surface including ion implanting, sputtering, bombarding, or energetic deposition, as in the case of the use of an HDP deposition tool. In some embodiments, an angled implant may be utilized. For example, an angle of approximately 5 to 10 degrees may be used in some embodiments. In one embodiment, the angled implant or bombardment I may be carbon dioxide, carbon monoxide, or carbon. Alternatively or in addition, fluorine may be used. As another example, the ions may actually be in the form of an ion deposition or bombardment by the tool used to form the dielectric layer 14, such as an HDP tool.

As a result, all exposed dielectric surfaces are doped by carbon, followed by carbon diffusion into the dielectric. "Doping" is used to indicate that carbon enters the dielectric structure even though the doping species may not be substitutional in the molecular structure of the dielectric. Thus, as indicated at 18, as a result of the angled implant or bombardment, the carbon enters the exposed upper planar surfaces of the dielectric 14 and the walls of the trenches 16 to a greater or lesser extent. Generally, the wider portion of the trench receives more doping than the narrower lower portion.

Figure 4:
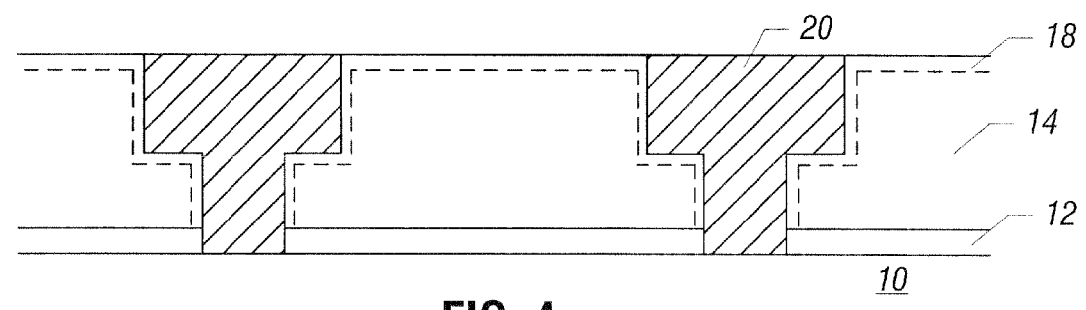
FIG. 4 is an enlarged, cross-sectional view at a stage subsequent to that shown in FIG. 3 in accordance with one embodiment.

Then, referring to FIG. 4, the etch stop layer 12 aligned under the trench 16 may be removed and the trench 16 may be filled with a metal, such as copper, according to the conventional damascene procedure.

In some embodiments, dielectric regions of different quality are formed in the resulting structure. For example, the dielectric material along the periphery of the metal lines 20 may be of a desirably lower dielectric constant, caused by carbon ions. The remainder of the dielectric may maintain sufficient strength in the bulk of the material that was not damaged by ion bombardment. Moreover, the dielectric material proximate to the upper, wider portion of the metal line 20 may be higher in carbon concentration than the material along the thinner, lower portion on a line.

In some embodiments, in addition to carbon bombardment, the exposed dielectric surface may also be bombarded by inert species, such as argon or xenon, on an implanter or an HDP tool. Surface heating during the inert species bombardment may result in diffusion of inert species, such as argon or xenon impurities, as well as carbon impurities, into the dielectric layer 14. Angled bombardment increases efficiency of sidewall bombardment while also reducing damage on the etch stop layer 12 at the bottom of the exposed trenches 16. The inert species bombardment may occur before, during, or after the carbon bombardment. However, advantageously, it occurs before or during the carbon or fluorine bombardment. In some cases, an anneal may be used to drive the bombarded impurities into the dielectric layer. The inert species bombardment may cause damage to the dielectric layer, reducing its dielectric constant.

In some cases, a relatively low energy, low dose bombardment is possible due to heating of the bombarded substrate. In one embodiment, the heating is due to bombardment by inert species. The bombardment energies for both carbon or fluorine and inert species may be 5 KeV or less, readily available in HDP tools. The heating causes diffusion which compensates for use of lower dose (e.g. $10^{15}$ to $10^{17}$ atoms per square centimeter) and lower energy bombardment. In some cases, the bombarded carbon or fluorine reacts with silicon in the dielectric layer 14, due to the effect of heating. In some cases, the inert species bombardment contributes to such a reaction due to surface amorphization caused by the inert species bombardment. Temperatures in the range of 500 to 650° C. may be advantageous in some cases. In some embodiments, heating is controlled or limited to avoid damaging underlying metallic layers.

Figure 5:
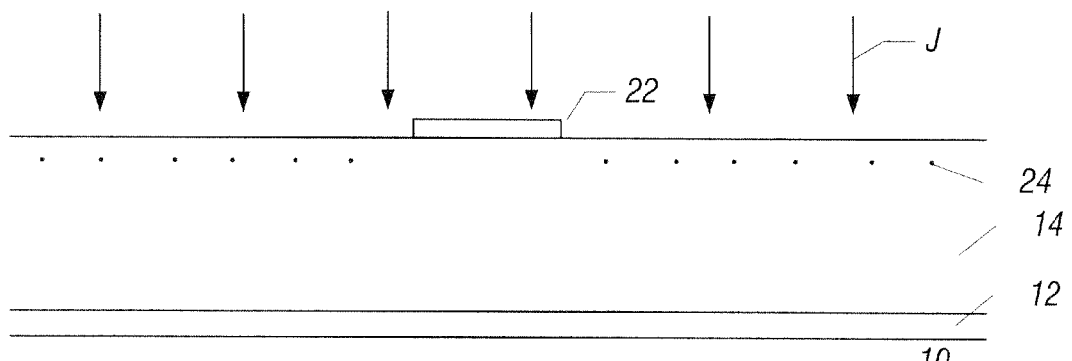
FIG. 5 is an enlarged, cross-sectional view at a stage subsequent to that shown in FIG. 1 in another embodiment.

In accordance with another embodiment, the structure shown in FIG. 1 is formed. Thereafter, a mask 22 is patterned and defined on the upper surface of the dielectric 14. For example, the mask 22 may be photoresist, designed to shield the region between two proximate trenches 16 in part, but not in whole, so that only the part of this region proximate to the trenches 16 is subjected to bombardment J, shown in FIG. 5. In one embodiment, the bombardment J may use carbon dioxide or carbon impurities. All exposed surfaces end up being doped by the carbon with ensuing carbon diffusion into the dielectric.

Figure 6:
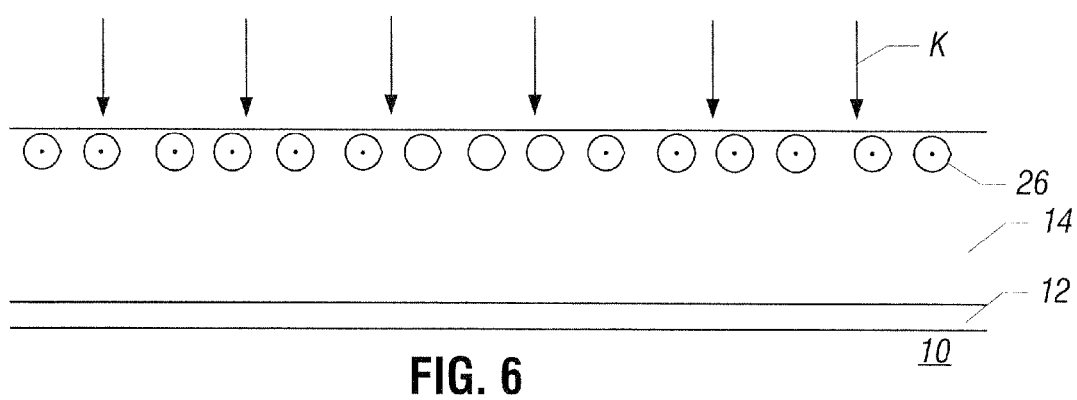
FIG. 6 is an enlarged, cross-sectional view at a stage subsequent to that shown in FIG. 5 in accordance with one embodiment.

Then, as shown in FIG. 6, the mask 22 is removed and the entire exposed surface is subjected to a second bombardment. The second bombardment K may be of an inert species, such as argon or xenon, on an ion implanter or an HDP tool, as two examples. Surface heating during the inert species bombardment may provide diffusion of both the argon or xenon, as well as carbon impurities. Thus, as indicated at 26, in some locations, both the implants J and K were received (circles with interior dots) in the dielectric surface, while only the second implant of the inert species is effective to dope the central area (open circles) masked by the mask 22.

Figure 7:
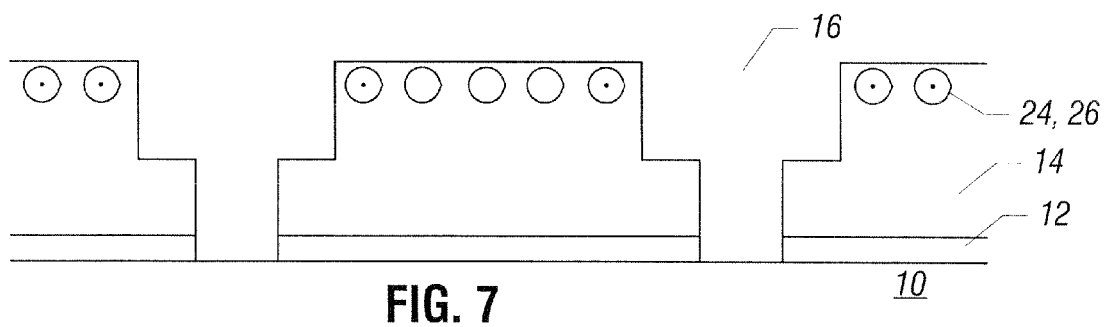
FIG. 7 is an enlarged, cross-sectional view at a stage subsequent to that shown in FIG. 6 in accordance with one embodiment.

Then, as shown in FIG. 7, the trenches 16 may be formed with the same shape described previously in one embodiment. Between two proximate trenches 16, is a first region that was originally masked by the mask 22 and which received only the implant K. Two regions on either side of the first region, proximate to the trenches 16, received both the implant J and the implant K.

Figure 8:
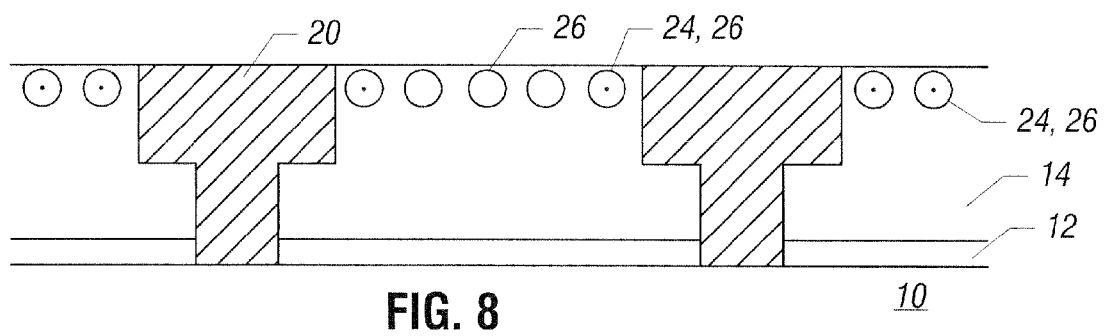
FIG. 8 is an enlarged, cross-sectional view at a stage subsequent to that shown in FIG. 7 in accordance with one embodiment.

Next, as shown in FIG. 8, the trenches may be filled with metal to form metal lines 20, after removing the etch stop layer at the bottom of the trenches 16, and planarized. As a result, the bulk of the dielectric layer 14 has good mechanical strength, but the region proximate to the metal lines 20 exhibits a low dielectric constant.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a mask on a dielectric layer;
   bombarding said dielectric layer with the mask in place;
   removing said mask;
   bombarding said dielectric layer after said mask was removed;
   forming trenches in said bombarded dielectric layer at two points spaced away from where the mask was positioned; and
   filling said trenches with a metal.

2. The method of claim 1 wherein bombarding includes ion implanting.

3. The method of claim 2 including ion implanting using carbon ions.

4. The method of claim 3 including bombarding said dielectric layer with an inert species.

5. The method of claim 4 including bombarding using at least one of argon or xenon.

6. The method of claim 1, including forming a metal line in said trenches.

7. The method of claim 1 including bombarding inert species across the entire surface of said dielectric layer after removing said mask.

8. An apparatus comprising:
   a substrate;
   a dielectric layer over said substrate;
   a pair of first regions of said dielectric layer including both first impurities and second impurities between said metal lines; and
   a second region of said dielectric layer between said metal lines and between said first regions, said second region indicating said second impurities, but not said first impurities.

9. The apparatus of claim 8 wherein said dielectric layer is formed of a single dielectric material.

10. The apparatus of claim 8 wherein said dielectric material is a bombarded dielectric.

11. The apparatus of claim 8 wherein said second impurities include carbon impurities.

12. The apparatus of claim 11 wherein said first impurities include inert impurities.

13. The apparatus of claim 8, said first region having a lower dielectric constant than said second region.

14. The apparatus of claim 8 wherein said first region being ion implanted.

\* \* \* \* \*